United States Patent [19]

Stoutmeyer et al.

[11] 4,131,793
[45] Dec. 26, 1978

[54] LATERAL PHOTODETECTORS

[75] Inventors: Ronald G. Stoutmeyer; William O. Alltop, both of China Lake, Calif.

[73] Assignee: The United States of America as represented by the Secretary of the Navy, Washingtoon, D.C.

[21] Appl. No.: 713,570

[22] Filed: Aug. 10, 1976

[51] Int. Cl.² .............................................. H01L 31/02
[52] U.S. Cl. ................................... 250/211 J; 357/30
[58] Field of Search ........................ 357/30; 250/211 J

[56] References Cited
U.S. PATENT DOCUMENTS

| | | | |
|---|---|---|---|
| 3,207,902 | 9/1965 | Sandborg | 357/30 X |
| 3,492,621 | 1/1970 | Yamada et al. | 357/30 X |
| 3,742,223 | 6/1973 | Carr et al. | 250/211 J |
| 3,971,057 | 7/1976 | Connors et al. | 357/30 |

Primary Examiner—Maynard R. Wilbur
Assistant Examiner—Richard E. Berger
Attorney, Agent, or Firm—R. S. Sciascia; W. T. Skeer; K. G. Pritchard

[57] ABSTRACT

A lateral photodetector having a segmented annular ring formed on the output surface. The segments are electrically interconnected to provide four interleaved output electrodes.

12 Claims, 5 Drawing Figures

LATERAL PHOTODETECTORS

BACKGROUND OF THE INVENTION

1. Field of the Invention

The present invention relates to lateral photodetectors and more particularly to a lateral photodetector having interleaved output electrodes for improving the lateral response of the detector.

2. Description of the Prior Art:

In the prior art, several methods are used for improving the linear response of a four electrode lateral photodetector.

One method involves processing the detector output currents using a log-difference function processor. This method improves the linear response of the detector by approximating a solution to Laplace's equation over a sheet resistor using the detector electrodes as boundary conditions.

Another method is based on the fact that previous lateral photodetectors have a radial distortion pattern. Shaped electrodes are used to reduce the effects of this radial distortion in the output currents. A lens is used to counter the residual distortion.

Still another method uses a resistive grid formed on the detector output surface and connected to the detector electrodes. This method allows sampling of the output current over a smaller surface area, thus reducing distortion and improving linear response.

As a means of further increasing linear response, the log-difference processing method has been applied to the detector output currents obtained from the shaped electrode and the resistive grid methods.

SUMMARY OF THE INVENTION

The present invention is a lateral photodetector having an annular boundary ring formed on the detector output surface.

The boundary ring is segmented to form a plurality of small current collectors. The collectors are electrically connected into four equal groups to form four output electrodes. Alternate collectors are connected to each electrode so that the collectors of one electrode interleave with the collectors of the adjacent electrodes.

Each collector contributes current additively to its respective electrode. The amount of current each collector contributes is a function of its size and of its position with respect to a point source of light inputted into the detector. By selectively manipulating the size and location of the collectors, the linear response, or correspondence between the input point of a light spot to the output currents of the electrodes, may be improved.

Further improvement in the lateral response may be obtained by special processing such as log-difference function processing of the electrode output currents.

DETAILED DESCRIPTION OF THE PREFERRED EMBODIMENT

Figure 1:
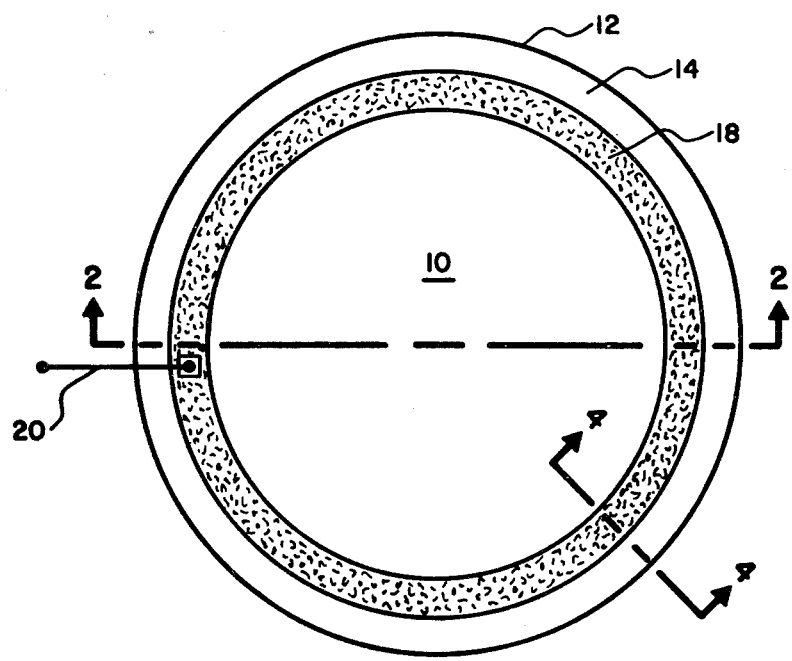
FIG. 1 is a front view of a lateral photodetector.
Figure 2:
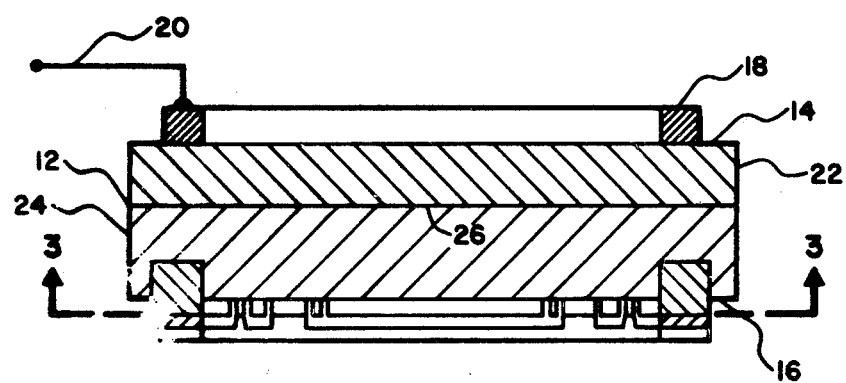
FIG. 2 is a cross sectional view taken on line 2—2 of FIG. 1.

Referring to FIG. 1, the present invention is incorporated in a lateral photodetector 10 which has a semiconductor body 12 with a front surface 14 and an opposing rear surface 16 (shown in FIG. 2).

The front surface 14 is substantially circumscribed by an annular bias electrode 18 connected thereto. The bias electrode 18 is connected to a source of bias potential (not shown) by a conductor 20.

Referring to FIG. 2, the semiconductor body 12 is made up of a layer of p-type material 22 and a layer of n-type material 24 joined together to form a p-n junction 26. For other applications, other semiconductor material, such as Schottky barrier, for example, may be used.

Figure 3:
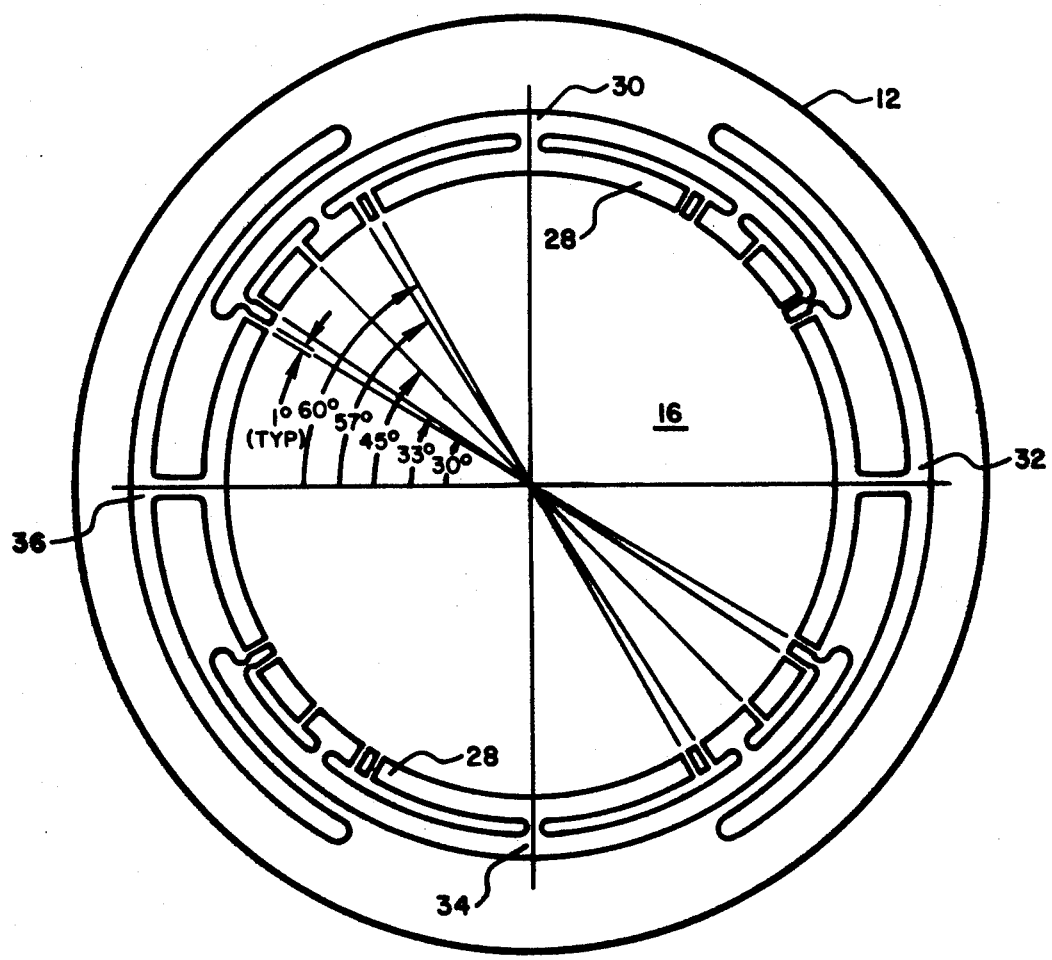
FIG. 3 is a cross sectional view of the photodetector taken on the line 3—3 of FIG. 2.
Figure 5:
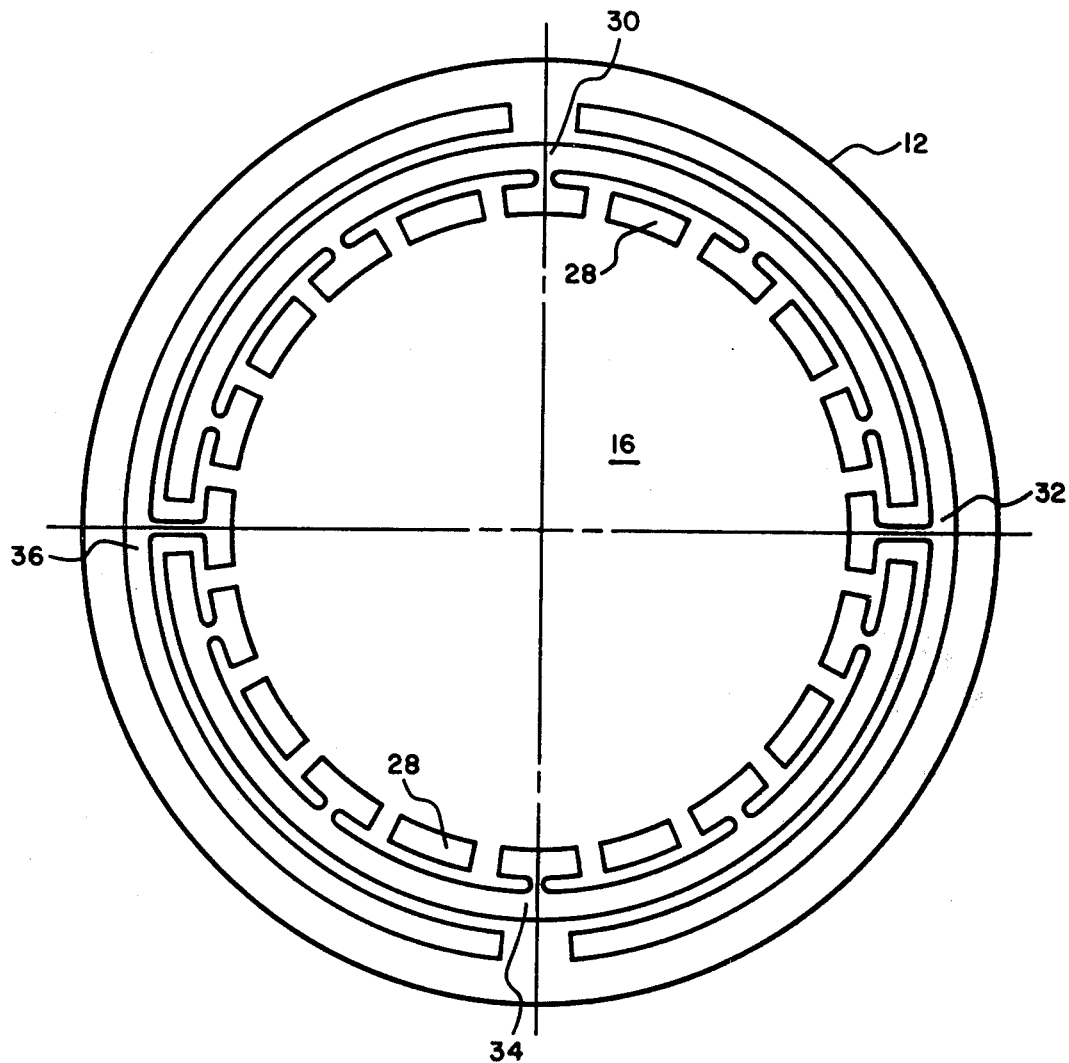
FIG. 5 is the same as FIG. 3 for the special case of equal segment size.

Referring to FIG. 3, the rear surface 16 is substantially circumscribed by annular boundary ring 28 formed thereon. The annular boundary ring 28 is segmented with the preferred embodiment having segments of varying size, dependent upon their location, as shown in FIG. 3. FIG. 5 shows a general case with the annular boundary size ring 28 divided into segments of equal size. The number of segments is defined by the equation $N_T = 4(2I-1)$ where $N_T$ is the total number of segments and I is any integer greater than one.

Four arcuate, spaced collectors 30, 32, 34, 36 are formed on the rear surface 16 between the segmented annular ring 28 and the periphery of the rear surface 16. These collectors are arranged in opposed pairs 30, 34 and 32, 36. These pairs are located on opposite sides of rear surface 16. Each collector is placed adjacent to the two collectors in the pair to which it does not belong. For example, collector 30 is on the opposite side of rear surface 16 from its opposed pair collector 34 and adjacent to both collectors 32 and 36. Collector 34 is also adjacent to both collectors 32 and 36.

Alternate segments of the boundary ring 28 are electrically connected to the collectors 30, 32, 34, 36 to form four output electrodes. The number of segments electrically connected to each electrode is defined by the equation $N_S=N_T/4$ where $N_S$ is always an odd integer.

By connecting alternate segments to the collectors, the segments forming each electrode interleave with the segments forming the adjacent electrodes. The segments shown in FIG. 3 show the general property that the center segment should be the longest segment connected to each collector with the remaining segments becoming shorter in length as they become nearer the end of the collector. The angular spacings shown in FIG. 3 are typical only for the twenty segment ring shown. The spacings shown produce a better linear response than the even length segments shown in FIG. 5. In turn, FIG. 5 produces a better linear response than four one piece electrodes. Increased linear response is achieved if a larger number of segments, $N_T$, are used following the general pattern shown in FIG. 3.

Most segment to collector connections are formed on the rear surface 16. However, in order to interleave the segments of adjacent electrodes, some segments to collector connections must be made by electrical jumpers. The number of jumpers (J) required for each detector is given by the equation $J=2(N_s-1)$.

Figure 4:
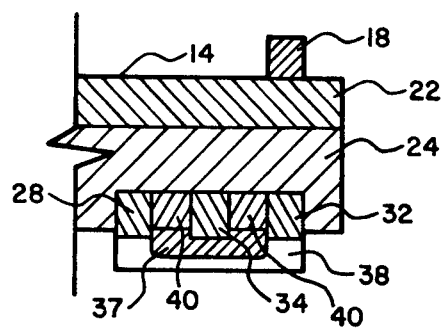
FIG. 4 is a cross sectional view taken on line 4—4 of FIG. 1.

FIG. 4 shows one method of providing the required jumpers. In this method, a layer of insulating material 37 isolates the intervening collector 34. A layer of conductive material 38, electrically connecting segment 28 and collector 32, is then placed over the insulating material 37. Spacers 40 insulate the gaps between ring 28 and collector 34 and between collectors 34 and 32. For other applications, other jumper means, such as point-to-point jumper wires, for example, may be used.

In operation, radiation is focused on a point on the detector front surface 14. The radiation impinging on the front surface 14 releases hole-electron pairs in the semiconductor material. The bias voltage applied to bias electrode 18 forces majority carriers to the rear surface 16.

When the majority carriers reach the rear surface, an electropotential gradient is set up, causing current to flow from the point the majority carriers contact the rear surface to the segment of boundary ring 28.

Each individual segment contributes current additively to its respective collector as a function of that segment's size and position with respect to the majority carrier contact point on the rear surface. By selectively manipulating the size of the segments, the total current added to each collector by its connected segments may be varied in a manner that provides electrode output currents representative of the radiation input point on the detector front surface, thereby improving linear response.

Further improvement in the detector linear response may be obtained by log-difference processing the resulting detector electrode output currents.

What is claimed is:

1. A lateral photodetector comprising:
   semi-conductor means having first and second opposite surfaces;
   said first surface oriented to receive radiation impinging as a point source on said first surface;
   means attached to said first surface for predeterminately biasing said first surface into an operative condition;
   means adjacent to said first surface and responsive to said radiation impinging on said first surface in said operative condition to release hole-electron pairs;
   means on said second surface responsive to said released hole-electron pairs to generate currents on said second surface;
   said current generating means including an annular boundary ring,
   said annular boundary ring being segmented with the number of segments being defined by the equation; $N_T = 4(2I-1)$, where $N_T =$ total number of segments, $I =$ any integer greater than one (1); and
   a plurality of collector electrodes placed adjacent to one another around said segmented annular boundary ring on said second surface with said segments of said annular boundary ring alternately connected to said adjacent collectors.

2. The device of claim 1 wherein said semi-conductor means comprises a layer of p-type material and a layer of n-type material joined together to form a p-n junction.

3. The device of claim 1 wherein the segments of said annular boundary ring are of varying size, each said segment size predetermined by the location of each said segment with respect to the collector electrode to which said segment is electrically connected and the number of segments desired.

4. The device of claim 1 wherein the segments of said annular boundary ring are of equal size.

5. The device of claim 2 wherein the segments of said annular boundary ring are of varying size, each said segment size predetermined by the location of each said segment with respect to the collector electrode to which said segment is electrically connected and the number of segments desired.

6. The device of claim 2 wherein the segments of said annular boundary ring are of equal size.

7. The device of claim 1 wherein said semi-conductor means comprises a Schottky barrier.

8. The device of claim 7 wherein the segments of said annular boundary ring are of varying size, each said segment size predetermined by the location of each said segment with respect to the collector electrode to which said segment is electrically connected and the number of segments desired.

9. The device of claim 7 wherein the segments of said annular boundary ring are of equal size.

10. In a lateral photodetector having a front surface capable of receiving a point source of radiation as an input and an opposite rear surface capable of outputting a plurality of electrical currents representative of the point said radiation is inputted into said front surface, the method of improving the correspondence of said currents to the input point of said radiation comprising the steps of:
    providing an annular boundary ring on said photodetector rear surface;
    segmenting said annular boundary ring into a plurality of segments defined by the equation; $N_T = 4(2I-1)$, where $N_T =$ the number of segments, $I =$ any integer greater than one (1);
    enclosing said segmented annular boundary ring with a plurality of collector electrodes placed adjacent to one another; and
    electrically connecting alternate segments to said adjacent collector electrodes.

11. The method of claim 10 and further including segmenting said annular boundary ring into segments of equal size.

12. The method of claim 10 and further including segmenting said annular boundary ring into segments of varying size, each said segment size predetermined by the location of each said segment with respect to the collector electrode to which said segment is electrically connected and the number of segments desired.

* * * * *